United States Patent

Ragard et al.

[11] 4,169,541
[45] Oct. 2, 1979

[54] DIP COMPONENT STORAGE AND DISPENSING MAGAZINE

[75] Inventors: Phillip A. Ragard; Robert H. Holmes, both of Binghamton, N.Y.

[73] Assignee: Universal Instruments Corporation, Binghamton, N.Y.

[21] Appl. No.: 860,728

[22] Filed: Dec. 15, 1977

[51] Int. Cl.² ............... B65G 59/06; H05K 13/02
[52] U.S. Cl. ............................. 221/281; 221/298
[58] Field of Search ............ 221/297, 298, 299, 301, 221/281; 29/741

[56] References Cited

U.S. PATENT DOCUMENTS

| 1,249,141 | 12/1917 | Litchfield | 221/301 X |
| 1,621,098 | 3/1927 | Anderson et al. | 221/297 |
| 3,138,288 | 6/1964 | Ine et al. | 221/298 X |
| 3,727,284 | 4/1973 | Ragard et al. | 29/741 X |
| 3,760,484 | 9/1973 | Kowalski | 221/129 X |

Primary Examiner—Francis J. Bartuska
Attorney, Agent, or Firm—Fidelman, Wolffe & Waldron

[57] ABSTRACT

DIP components are released from storage in a generally vertical chute when a spring-biased first finger blocking the chute exit is pivoted away. A second finger presses laterally on a prong of the second lowest stored component and limits dispensing to a single component for each actuation of the first finger.

2 Claims, 5 Drawing Figures

U.S. Patent  Oct. 2, 1979  Sheet 1 of 2  4,169,541
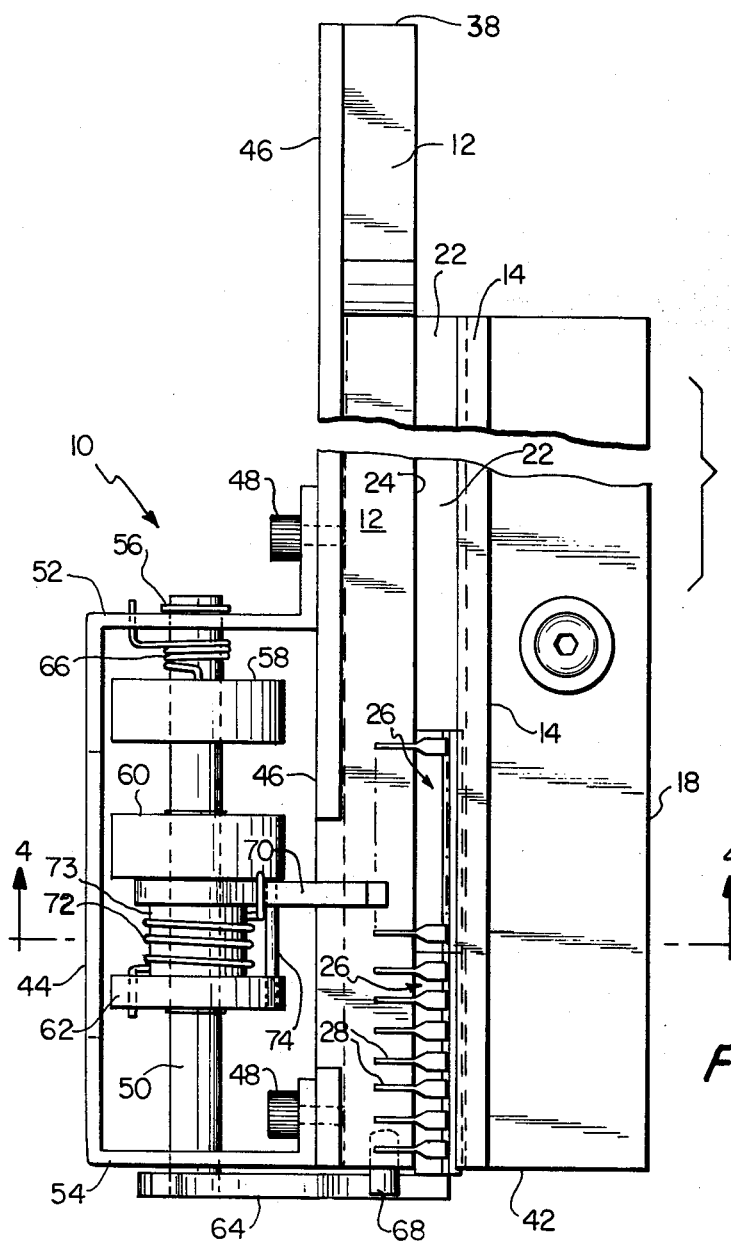
FIG. 5
FIG. 1
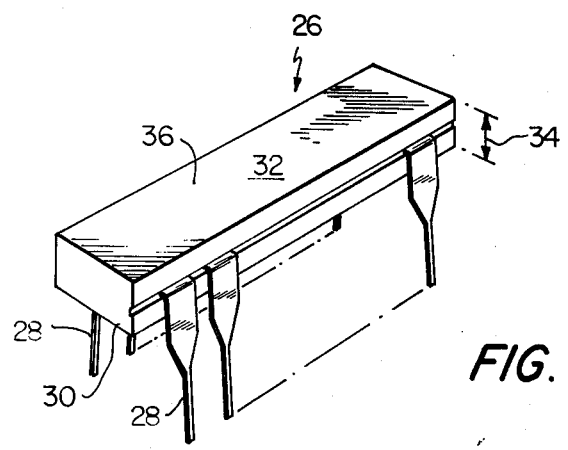
FIG. 2

DIP COMPONENT STORAGE AND DISPENSING MAGAZINE

BACKGROUND OF THE INVENTION

This invention relates generally to a gravity feed storage and dispensing magazine which dispenses items from storage singly and more particularly to a device for dispensing electronic components having dual in line prongs (DIP).

The use of integrated circuit boards in electronic equipment of all types is burgeoning because of the development of standardized circuit components and the adoption of machinery for economically and automatically assembling standardized components onto circuit boards. For efficient operation of such machines it is necessary that components, generally in an assortment of electrical and physical sizes and types, be stored in the machine itself and be readily available for instant withdrawal from storage when needed. Additionally proper component storage and dispensing protects the components from damage which frequently occurs when components are randomly stored.

Manually initiated component dispensing from the magazines of this invention may be used in semi-automatic assembly machines, but more recently designed assembly machines are fully automated, and often computer controlled. Dispensing of a component from the storage magazine in such a machine is but one in a series of automated steps by which the component is operated on until it is finally mounted on the circuit board.

Standardized component modules packaged with two rows of parallel lead prongs, i.e. dual in line prongs (DIP), extending from a rectangular body, are now extremely common in the industry. The leads extend from two sides of the body and bend at right angles to extend generally parallel and in the same direction. Most components have 14 to 16 leads but there can be more or less. These leads are pressed into multi-receptacle sockets mounted to the circuit board or the leads are inserted through holes in the circuit boards.

There is a need in the industry for a simple, trouble free, storage magazine which dispenses single DIP components of various sizes at a preferred orientation, and which is easily loaded with components without interruption of the dispensing operations.

SUMMARY OF THE INVENTION

The storage magazine of this invention includes a generally enclosed vertical chute which is filled with DIP components stacked one atop the other in an end to end arrangement. The rows of lead prongs straddle a central guide rail within the chute such that all components maintain the same orientation. The lower or discharge end of the chute is blocked by a spring-biased, pivotable finger which prevents the release of a component. When the finger is pivoted away from the chute opening, gravity causes the lowest component to fall freely from the chute. However, just prior to the release of the lowest component, a second finger pivoting on a common shaft with the first finger, moves into lateral contact with a prong of the second, next lowest component in the chute. The force of the second finger presses the lead prongs against the guide rail and this force combined with friction retains in position the second component, and all components in the chute above, when the lowest component is released and drops from the chute.

When the first finger is allowed to return to its original chute-closing position, first the bottom of the chute is blocked and secondly, the second finger releases the component prong allowing the next component to drop by gravity to rest against the first finger at the lower end of the chute. The procedure may now be repeated.

The storage magazine is loaded by insertion of components at the open top of the chute. At the time of insertion, the component lead prongs are positioned to straddle the guide rail and top-end—bottom-end orientation of the component is set in a preferred manner if the application at the discharge end of the chute so requires.

A magazine of this type is suited, for example, to an apparatus for selecting and inserting dual-in-line components as disclosed in the U.S. Pat. No. 3,727,284 by Ragard, et al.

Accordingly, it is an object of this invention to provide a storage and dispensing magazine which dispenses DIP components singly from storage.

It is a further object of this invention to provide a magazine which dispenses DIP components with a preferred orientation.

Still another object of this invention is to provide a magazine which can be loaded with additional components without interruption of dispensing operations.

Yet another object of this invention is to provide a magazine which can dispense various size components without modification or adjustment.

Other objects, advantages and novel features of the present invention will become apparent from the following detailed description of the invention when considered in conjunction with the accompanying drawing in which:

FIG. 1 is a side elevation of the storage and dispensing magazine of this invention.

FIG. 2 is a perspective view to an enlarged scale of a DIP component for use with the magazine of FIG. 1.

FIG. 5 is a partial right-side view of the magazine of FIG. 1.

Figure 3:
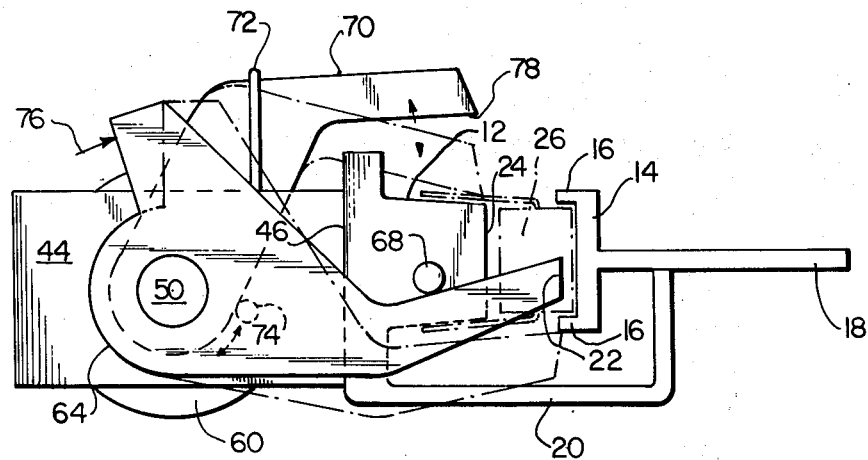
FIG. 3 is a bottom view of the magazine of FIG. 1.

With reference to the Figures, the storage and dispensing magazine 10 of this invention is comprised of an elongated guide rail 12 spaced apart from an opposing shallow channel 14. The flanges 16 of the channel 14 extend toward the guide rail 12 and a mounting strip 18 extends from the back of the channel 14 away from the guide rail 12. A web 20 joins the base of the guide rail 12 to the channel 14 in a fixed relationship which provides an elongated chute 22 between the top surface 24 of the guide rail 12 and the channel 14. Dip components 26 (FIG. 2) are stored end to end in this chute 22 with their two rows of lead prongs 28 astraddle the guide rail 12 and with the underside 30 of the DIP body 32 riding on the top surface 24 of the guide rail 12. Depending upon the height 34 of the component 26, the upper surface 36 may nest with a sliding fit between the flanges 16 of the channel 14. Generally however with standard components there is a clearance between the DIP component 26 and the channel 14.

Accordingly a DIP component 26 placed with lead prongs 28 astride the guide rail 12 is free to slide the length of the magazine 10. At the upper end 38 of the magazine 10, the central guide rail 12 extends beyond the channel 14 and is narrowed in width 40 (FIG. 5) to facilitate loading components 26 into the chute 22 of the magazine 10 from the upper end 38. The magazine chute 22 with guide rail 12 and channel 14 as described above had been satisfactorily produced from a single aluminum extrusion or by fastening together in any conventional manner of several extruded elements. The guide rail 12 tapers symetrically toward the channel 14 (FIG. 3) to correspond with the slightly spread-apart condition common to the prongs 28 of standard DIP components 26 thereby further facilitating smooth sliding of components 26 through the chute 22 as discussed hereinafter.

At the lower end 42 of the magazine 10 a generally rectangular bracket 44 attaches to the base 46 of the guide rail 12 by means of machine screws 48. The circular shaft 50 is rotatably supported between the ends 52, 54 of the bracket 44 and is constrained from movement in the downward direction by the snap-ring 56 which in the known manner seats in a circular slot (not shown) around the shaft 50. The longitudinal axis of the shaft 50 is generally parallel to the guide rail 12.

Between the bracket ends 52, 54, a trio of separated disks 58, 60, 62 are concentrically and rigidly attached to the shaft 50. An elongated finger 64 is rigidly attached to the lower end of the shaft 50 where the shaft 50 protrudes through the lower bracket end 54. The finger 64 extends adjacent the lower end 42 of the magazine guide rail 12 and channel 14 and substantially blocks the open chute 22 (FIGS. 1, 3) such that a DIP component 26 stored in the chute 22 cannot drop from a vertically positioned magazine 10. The spring 66 is coiled in torsion around the shaft 50 between the upper end 52 of the bracket 44 and the upper disk 58, with one end of the spring 66 engaged in the bracket end 52 and the other end engaged in the disk 58. The torsional force in the coiled spring 66 biases the finger 64 to remain in position to block the chute 22, and the stop pin 68 limits the counterclockwise travel (FIG. 3) of the finger 64 under the influence of said spring 66.

A second finger 70 is rotatably mounted on the shaft 50 adjacent to the lower surface of the middle disk 60 which prevents upward motion of the finger 70. A sleeve 73 on the shaft 50 resting on the lower disk 62 prevents downward motion of the second finger 70.

The spring 72 is coiled around the shaft 50 with one end of the spring 72 engaging the lower disk 62 and the other end of the spring 72 engaging the second finger 70. The spring 72 biases the second finger 70 toward the guide rail 12, i.e. clockwise as seen in FIGS. 3, 4 and the pin 74 extending from the disk 62 contacts the second finger 70 and prevents such clockwise motion.

When an external force is applied to the lower finger 64 as indicated by the arrow 76 in FIG. 3, the shaft 50 rotates clockwise and the finger 64 pivots clockwise to the position indicated by broken lines to uncover the chute 22. Concurrently with the motion of the lower finger 64, the second finger 70, urged by the spring 72 which in turn is driven by the disk 62, moves clockwise until the far end 78 of the finger 70 presses against a single prong 28 of the second DIP component 26 stored in the chute 22, i.e. stored next above the lowest DIP component 26. This contacting position of finger 70 is shown in broken lines in FIG. 4. The force of the finger 70 against the prong 28 holds the second component 26 against the central guide rail 12 and prevents any motion of said second component 26 toward the lower end 42 of the magazine 10. The holding action of the second finger 70, as aforesaid, occurs before the lower finger 64 moves sufficiently to entirely unblock the chute 22. After first contact is made between the second finger 70 and the prong 28, further rotation of the shaft 50 causes the finger 70 to pivot on the shaft, i.e. counterclockwise relative to the shaft 50 itself, with the spring 72 progressively increasing the force exerted by the finger 70 to hold the prong 28.

Figure 4:
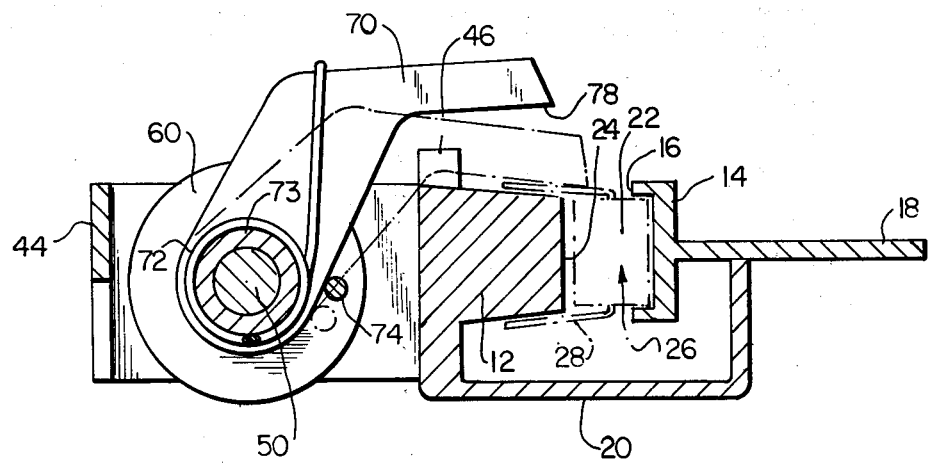
FIG. 4 is a sectional view taken along the line 4—4 of FIG. 1.

Accordingly in operation of the magazine 10 to release a single component 26, a force 76 is applied to the finger 64 causing both the finger 64 and the shaft 50 to rotate clockwise (FIGS. 3, 4). The second finger 70 rotates simultaneously and contacts a prong 28 of the second lowest component 26 in the chute 22 prior to the moment when the lower finger 64 clears the lower opening of the chute 22. The lowest component 26 in the chute 22 then drops from the magazine 10 but the second component 26 remains fixed by the pressure of the second finger 70. All remaining components 26 in the magazine 10 remain fixed until the force acting on the lower finger 64 is removed. Then the torsion of the springs 66, 72 causes the lower finger 64 to move counterclockwise until it rests against the stop pin 68. In the process of the spring return, the second component 26 is released from the lateral pressure exerted by the second finger 70 as the second finger 70 moves away from the guide rail 12 and returns to its original position. Once the lateral pressure is removed from the prong 28, the second component 26 drops until it rests against the lower finger 64 which is already partially blocking the exit of the chute 22. All other components 26 in the magazine 10 slide down to rest atop the next lower component 26 and the operational procedure may be repeated.

It should be understood that the force 76 which causes rotation of the shaft 50 to open the chute exit may be applied directly or via a linkage either manually or by means of a piston, solenoid, or cam drive, etc. in a known manner.

The use of a laterally acting second finger 70 has the advantage of accommodating prongs 28 of varying thicknesses. A thinner prong 28 merely causes less pivoting of the second finger 70 relative to the shaft 50 when a component 26 is released from the magazine 10, and more pivoting when the prong is thicker.

Also a laterally acting second finger 70 has the advantage of accommodating components 26 having different numbers of prongs 28. If, for example, the finger 70 presses on the lowest prong 28 of the second component 26 when the components 26 have eight pairs of prongs, i.e. a sixteen prong DIP module, then the magazine can be loaded with seven-pair components and the second finger 70 will press on the second lowest prong 28 of the second component 26, and so forth. Thus, DIP components 26 having a range of prong quantities can be used in the magazine 10 without modification of the apparatus or impairment of dispensing performance.

It should be understood that in an alternative embodiment of this invention the spacing between the fingers 64, 70 can be such that multiple quantities of DIP components 26 are dispensed upon each activation. Further in another alternative embodiment the guide rail 12 and channel 14 above the bracket 44 may be curved so long as gravity feed remains effective to move components 26 through the chute 22. A removable closure may be incorporated at the upper end 38 of the magazine 10 to prevent entry of extraneous matter.

In still another embodiment of this invention the second finger 70 is located along the shaft 50 such that upon actuation of the shaft 50 as stated above, the finger 70 passes between two prongs 28 of the second component 26 and presses laterally against the central guide rail 12. This position of the second finger 70 between the prongs 28 prevents motion of the second lowest component 26 at the time when the lowest component 26 is dispensed. In all the other ways operation of the apparatus is similar to that described above.

From the preceding description, it is evident that the objects of the invention are attained and although the invention has been described and illustrated in detail, it is to be clearly understood that the description is by way of illustration and example only and is not to be be taken by way of limitation. The spirit and scope of this invention being limited only by the terms of the appended claims.

What is claimed is:

1. A magazine for vertical storage and dispensing of a plurality of DIP components, said storage being end to end, comprising:

an elongated guide rail parallel and opposed to and spaced apart from an elongated channel to form a chute therebetween, said guide rail being contoured to be straddled with a sliding fit by opposed pairs of prongs of said DIP components, said spacing apart being only sufficient to pass the body of said DIP components;

a first finger rigidly attached to and rotating with a shaft, said shaft being parallel to said guide rail and said channel, said first finger being located in proximity to and blocking the discharge end of said chute;

a second finger, pivotably attached to said shaft, said second finger being spaced above said discharge end of said chute and apart from said first finger and said second finger being spaced apart from said guide rail when said first finger blocks the discharge end of said chute, said second finger moving laterally against a prong of the next lowest of said stored DIP components when said shaft is rotated causing said first finger to unblock said chute;

said shaft including a first spring to bias said first finger toward said position blocking the discharge end of said chute, said shaft rotation to unblock said chute being opposed by said spring bias, whereby when the force causing said shaft rotation is removed, said shaft and said fingers return to their original positions and the cycle may be repeated; and a second spring interconnected between said shaft and said second finger, said second spring being biased to maintain a fixed position of said second finger relative to said shaft, said second finger pivoting relative to said shaft in opposition to said spring bias when said second finger moves against said DIP prong as said shaft rotates to unblock said chute, whereby said second finger retains said next lowest component before said lowest component is dispensed and different thicknesses of said prong may be accommodated.

2. The magazine of claim 1 wherein the end of said chute away from said first finger is open, whereby said chute may be loaded with said components while components are dispensed from other end of said chute.

* * * * *